United States Patent [19]
Goutelard

[11] Patent Number: 5,825,261
[45] Date of Patent: Oct. 20, 1998

[54] PASSIVE, APERIODIC PHASE SHIFTING AND ATTENUATING DEVICE FOR ELECTRIC SIGNALS

[75] Inventor: Claude Goutelard, Bretigny sur Orge, France

[73] Assignee: Compagnie D'Etudes, de Realisations et D'Installations de Systems (Coris), France

[21] Appl. No.: 809,981

[22] PCT Filed: Aug. 8, 1996

[86] PCT No.: PCT/FR96/01267

§ 371 Date: May 30, 1997

§ 102(e) Date: May 30, 1997

[87] PCT Pub. No.: WO97/06596

PCT Pub. Date: Feb. 20, 1997

[30] Foreign Application Priority Data

Aug. 9, 1995 [FR] France .................................. 95 09659

[51] Int. Cl.⁶ ................................................. H03H 7/20
[52] U.S. Cl. .......................................... 333/139; 333/81 R
[58] Field of Search ....................... 333/81 R, 138–140, 333/156

[56] References Cited

U.S. PATENT DOCUMENTS

| | | | |
|---|---|---|---|
| 4,558,291 | 12/1985 | Nichols | 333/139 X |
| 4,581,595 | 4/1986 | Silagi | 333/139 |
| 4,806,888 | 2/1989 | Salvage et al. | 333/138 |
| 4,977,382 | 12/1990 | Podell et al. | 333/156 X |

FOREIGN PATENT DOCUMENTS

| | | | |
|---|---|---|---|
| 0 408 323 | 1/1991 | European Pat. Off. | |
| 1-291509 | 11/1989 | Japan | 333/138 |
| 1-305709 | 12/1989 | Japan | 333/138 |
| 3-198401 | 8/1991 | Japan | 333/139 |

*Primary Examiner*—Robert J. Pascal
*Assistant Examiner*—Seungsook Ham
*Attorney, Agent, or Firm*—Anthony J. Casella; Gerald E. Hespos; Ludomir A. Budzyn

[57] ABSTRACT

A device provides, with passive circuits only, an output voltage in which each spectral component is phase-shifted and attenuated by programmable values in relation to the spectral component of same frequency of an input signal. An adapter circuit (CA) applies the input signal $V_E$ onto two transfer channels (VT1 and VT2) which generate two signals with quadrature spectral components and with amplitudes multiplied by a coefficient of $-1-+1$. These signals are added in an adder circuit (CAD) which provides the output signal. The driver circuit (CC) receives the required phase-shifting and attenuation commands and corrects, if need be, the defects of the assembly through the control signals of the transfer channels (VT1 and VT2).

10 Claims, 3 Drawing Sheets

PASSIVE, APERIODIC PHASE SHIFTING AND ATTENUATING DEVICE FOR ELECTRIC SIGNALS

BACKGROUND OF THE INVENTION

PRIOR ART

The present invention relates to a phase shifting and attenuating device for processing electric signals in the fields of radio communication, telecommunications, radar, sonar and signal processing.

In a signal processing or transmission chain the device transmits, at its output, each spectral component of the signal applied to its input, after imparting thereto a phase rotation or shift $\phi$ and an attenuation $\alpha$ defined by digital control signals applied to the device.

The phase shifting and attenuating device, also known as a weighting device, ensures, within an extensive frequency band, the generation of a wave the phases and amplitudes of the spectral components of which, in relation to those of a wave that is applied thereto, are adjustable and uniquely defined for the entire operating frequency band.

In practice, the attenuating operation is not selective, that is to say it can be carried out without modifying the commands over an extensive frequency band.

On the other hand, a phase shifting operation is necessarily selective, and, with the usual passive electric circuits, the commands have to be modified as a function of frequency.

To produce a passive device, ensuring the phase shifting function over an extensive frequency band, it is necessary to implement special circuits.

Present weighting devices fall into two categories.

In a first category, the weighting device is passive and separates the phase shifting and attenuation functions. It can, for example, be constituted by the use of sections of lines of variable lengths switched according to the frequency in order to obtain the desired phase shift, or by phase shifting circuits formed by assembling capacitors, inductors and resistors adjusted according to the frequency, in order to obtain the desired phase shift, and by an attenuator.

The devices in this first category are known as narrow band devices owing to the fact that an adjustment of the phase shift is valid only over a small extent of the frequency range. In addition, they necessitate the adjustment of the values of passive elements, often obtained by switching elements of different values.

In a second category, the weighting device is active, and can combine the phase shifting function and the attenuating function. It then uses either balanced modulators or frequency changers, or equivalent electronic systems. These devices introduce considerable electric noise, which makes them impossible to use when it is necessary to process weak signals; in addition, they are sensitive to the effects of intermodulation in the presence of signals of great amplitude such as, for example, interference signals in reception systems.

SUMMARY OF THE INVENTION

The present invention aims to provide a weighting device that remedies the aforementioned drawbacks, particularly by improving, by comparison with existing systems, the pass band, performance with regard to thermal noise and performance with regard to intermodulation defects, while, at the same time, cutting the manufacturing cost thanks to the use of components that are relatively simple and inexpensive.

For this purpose, a weighting device generating, from an input signal, an output signal, the spectral components of which are phase shifted and attenuated by given amounts in relation to the input signal, is characterised in that it includes:

A matching circuit which receives the input signal at its input in such a way as to deliver, at two outputs, output 1 and output 2, of the matching circuit, two output signals that are images of the input signal, in phase or in phase opposition with the input signal and having equal amplitudes that are constantly related to that of the input signal;

Two transfer channels, called transfer channel 1 and transfer channel 2, transfer channel 1 receiving the signal produced by output 1 of the matching circuit and transfer channel 2 receiving the signal produced by output 2 of the matching circuit.

Each of the channels includes:

An inversion system which, depending on the command that is applied thereto, changes or does not change, the sign of the signal transmitted in relation to the input signal;

a phase shifting circuit which introduces, as to the signal that it transmits, a phase shift that is variable but known, in the useful frequency band The characteristics of the circuits are established so that the difference between the phase shift introduced by the phase shifting circuit of transfer channel 1 and the phase shift introduced by the phase shifting circuit of transfer channel 2 is, throughout the useful frequency band, equal to 90 degrees.

An aperiodic attenuator introducing an attenuation the value of which is chosen as a function of the desired weighting for the signal.

An adding circuit which calculates the algebraic sum of the signals delivered by the two transfer channels.

A spectral component of the input signal that can be represented by the function:

$$V_1 = V_0 \cos(\omega t + \psi)$$

the output signal is equal to:

$$V_S = V_0 [\pm A_1 \cos(\omega_0 t + \psi + \phi_0) \pm A_2 \sin(\omega_0 t + \psi + \phi_0)]$$

where $1/A_1$ and $1/A_2$ are the attenuations introduced respectively on transfer channels 1 and 2. The attenuation of an attenuator is defined by the ratio of the amplitude of the input voltage to that which it delivers at its output.

$\phi_0$ is the known phase shift introduced by channel 1 in pulse $\omega_0$

The signs ± associated with $A_1$ and $A_2$ are introduced by the inversion system described above.

This expression can be written as follows:

$$V_S = \alpha V_0 \cos(\omega_0 t + \psi + \phi)$$

where $\alpha = (A_1^2 + A_2^2)^{1/2}$ represents the attenuation imparted to the amplitude of the useful signal; $\phi$ is the desired phase shift defined by:

$$\cos \phi = A_1/\alpha$$

$$\sin \phi = A_2/\alpha$$

and which can assume all possible values between 0 and 360 degrees.

This device, according to the invention, includes a control system which acts on the inversion systems and on the programmable attenuation values of the attenuators.

The control device receives two sets of digital input signals representing, in agreed codes, the attenuation α and the desired phase shift φ.

The control device causes to correspond with the digital input signals the digital control symbols fixing the attenuation values $1/A_1$ and $1/A_2$ of the programmable attenuators in the control codes of the attenuators, as well as the digital control symbols of the inversion systems in their control codes.

According to the invention, the control system can include a correction system that improves the accuracy of the device.

The correction system indicates the values that have to be added to the attenuation values that would be provided by the attenuators if the device were perfect in order to obtain, in the real device, the attenuation values α and the phase shift φ and $φ_0$ of the signal desired, thus compensating for the imperfections of the device.

This correction is provided by dividing the useful frequency range into sub-ranges in which the values for the corrections made to the attenuations remain constant.

This correction is made to the attenuation values $1/A_1$ and $1/A_2$ defined hereabove.

The attenuation correction values are determined by pre-calibrating the device and remain valid throughout the life of the device.

The matching circuit is, preferably, a wideband transformer the secondary of which can be formed by a winding with a centre tap, two separate windings or a single winding. If the impedance values can be suitably chosen, the adaptor circuit can be reduced to a simple wire link.

The inversion system is preferably a unipolar inverter one of the terminals of which, a so-called common terminal, can be connected to one or the other of the other two terminals (non-common terminals).

These non-common terminals are connected to the two ends of a transformer winding the centre tap of which is connected to a fixed potential.

If this winding is a primary, the input signal is applied to the common terminal; if it is a secondary, the output signal is taken from the common terminal.

The inverter can be a relay the characteristics of which are appropriate for the useful frequency range, or a set of electronic switches with diodes, for example PIN or GaAs diodes.

The phase shifting system is preferably a circuit the transfer function modulus of which is constant over the useful frequency band and the characteristic impedance of which is equal to that of the circuits to which it is connected.

The variations in the phase of the transfer functions of these circuits are such that the difference between that of the phase shifting circuit of transfer channel 1 and that of the phase shifting circuit of transfer channel 2 is equal, throughout the useful frequency band, to 90 degrees.

These circuits are formed by assemblies of inductors and capacitors in order not to introduce energy losses. These circuits are preferably formed by lattice cells.

The attenuators are preferably networks of resistors switched by switches with electric or electronic relays formed by diodes with very low direct resistance values and high reverse resistance values, such as PIN or GaAa diodes. The networks are preferably formed by Pi cells.

The adding circuit is preferably a transformer with two wideband primary windings covering the useful frequency band.

The control circuit is preferably formed by an assembly of electronic circuits which receives at its input digital signals representing the desired attenuation α and desired phase shift φ of the useful signal.

If the correction signal is established using at least two sub-bands of the useful frequency band, the control system also receives at its input a third signal indicating the frequency sub-band used.

The signals applied represent the values α, φ, and the sub-band in agreed digital codes.

The circuit containing the correction values is preferably a memory area in which the values are written during a prior calibration stage.

BRIEF DESCRIPTION OF THE DRAWINGS

Further characteristics and advantages of the present invention will emerge more clearly from a study of the following description of a number of preferred embodiments of the invention, with reference to the corresponding annexed drawings, in which.

DETAILED DESCRIPTION OF THE INVENTION

Figure 1:
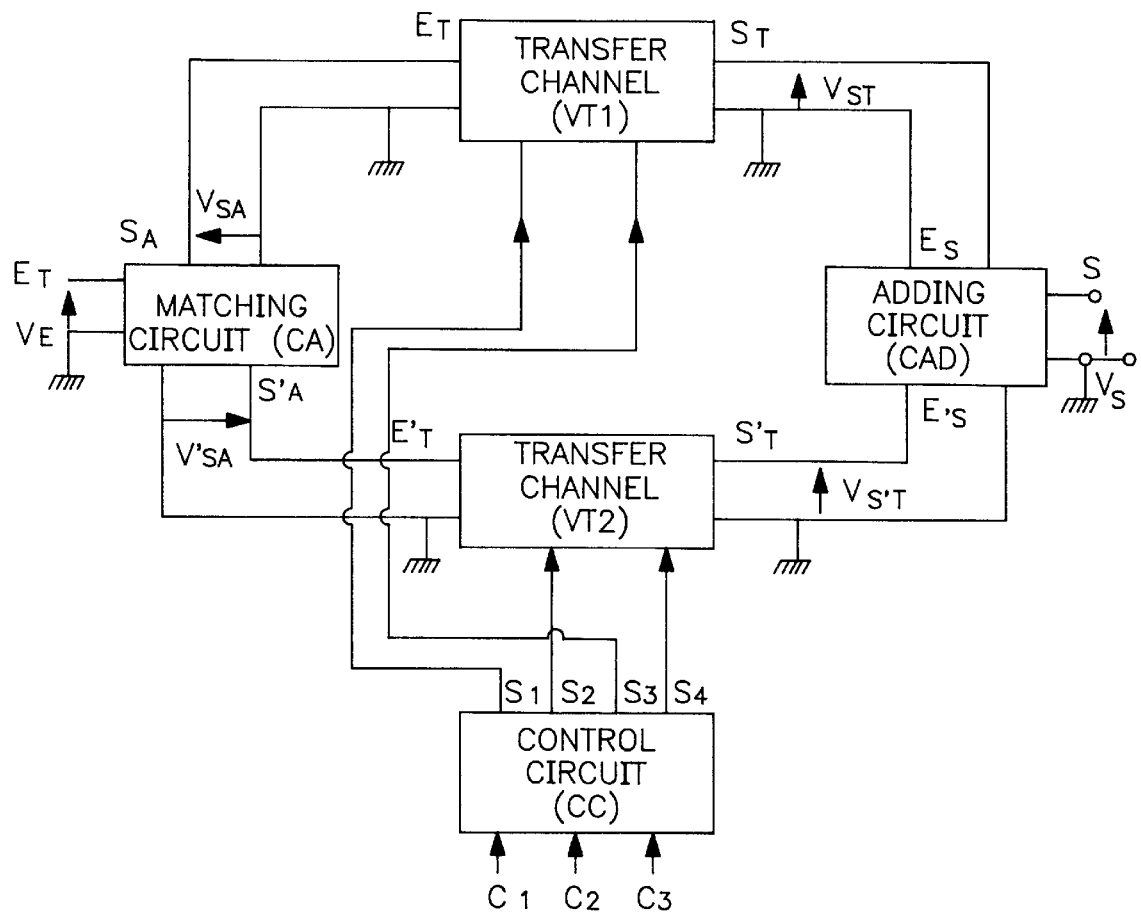
FIG. 1 is a schematic block diagram of a weighting device according to the invention.

With reference to FIG. 1, the weighting device produces at S a useful output signal Vs each spectral component of which is phase shifted and attenuated by programmable amounts in relation to the spectral component with the same frequency of the input signal applied at E and situated in the useful frequency band. The useful input and output signals are, for example, signals processed in telecommunications, radar or sonar or signal processing apparatus.

A matching circuit (CA), which can be reduced to simple wire links, produces, from the useful input signal Ve, two output signals $V_{SA}$ and $V_{S'A}$ such that $V_{SA}=V_{S'A}$ or that $V_{SA}=V_{S'A}$. This matching circuit is simply formed by a transformer available on the industrial products market, but it can be designed specially.

Signals $V_{SA}$ and $V_{S'A}$ are applied respectively to transfer channels VT1 and VT2, which are similarly constituted. These channels deliver voltages $V_{S1}$ and VS2 the amplitudes of which are fixed by the transfer channels and which are in phase quadrature, according to the principle described above.

Signals $V_{S1}$ and $V_{S2}$ are added in the adding circuit (CAD), which can be formed by a wideband transformer available on the industrial products market, but which can be designed specially.

Such a transformer is constituted by two primary windings and its secondary winding.

The signal delivered by the adding circuit is the useful output signal.

The control signal receives the two digital signals representing:

in the case of signal C1, the desired attenuation $\alpha$, in the case of signal C2, the desired phase shift $\phi$, and, if the correction system is used, and, if the number of sub-ranges defined for the correction is greater than or equal to 2:

in the case of signal C3, the indication of the operational frequency sub-range.

The control circuit produces the signals:

S1 which fixes the attenuation of the attenuator of transfer channel 1;

S2 which fixes the attenuation of the attenuator of transfer channel 2;

S3 which fixes the state of the inversion system of transfer channel 1;

S4 which fixes the state of the inversion system of transfer channel 2.

Figure 2A:
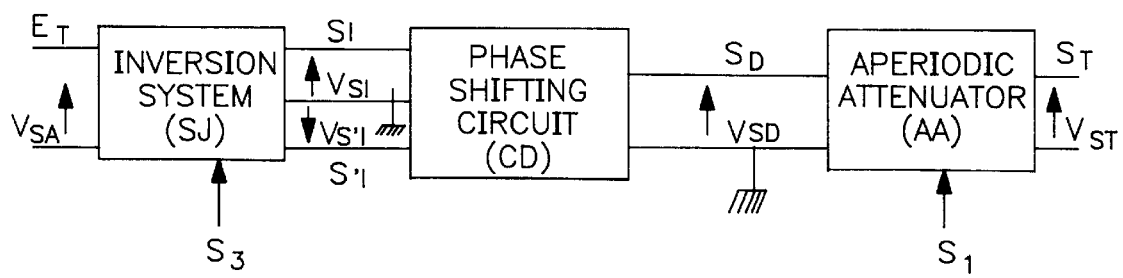
FIG. 2a is a first block diagram of a transfer channel associating an inversion system, a phase shifting circuit and an aperiodic attenuator.
Figure 2B:
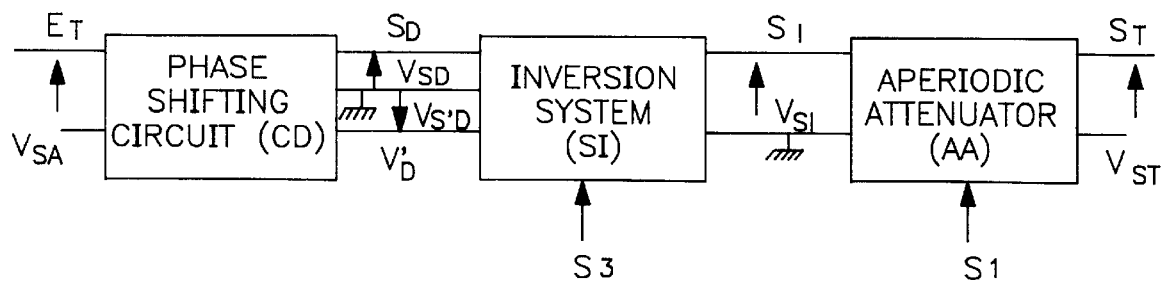
FIG. 2b is second block diagram of a transfer channel associating a phase shifting circuit, an inversion system and an aperiodic attenuator.

FIGS. 2-a, 2-b, 2-c are block diagrams of embodiments of a transfer channel.

Transfer channel 1 is the one described herein, transfer channel 2 being similar thereto. The transfer channel is formed by the cascading the inversion system, the phase shifting circuit and the aperiodic attenuator, which can be associated in different ways.

FIG. 2-a shows a first embodiment. Input signal $V_{SA}$ is transmitted to the output of the inversion system, which delivers voltage $V_{SA}$, either at terminal $S_I$, in which case $V_{SI}=V_{SA}$, while the potential $V_{S'I}$ of terminal $S'_I$ is not imposed by the inversion system, or at terminal $S'_I$, in which case $V_{S'I}=V_{SA}$, while the potential $V_{S'I}$ of terminal $S_I$ is not imposed by the inversion system.

These choices are governed by signal $S_3$ (S4 in the case of transfer channel 2).

The phase shifting circuit, when voltage $V_{SI}=V_{SA}$ is applied thereto, delivers at $S_D$ phase shifted voltage $V_{SD}$ and, when voltage $V_{S'I}=V_{SA}$ is applied thereto, voltage $V_{SD}$ undergoes an additional phase shift of 180 degrees in relation to the case in which $V_{SI}=V_{SA}$.

The phase shifting circuit of transfer channel 2 introduces an additional phase rotation of 90 degrees in relation to the phase shifter of transfer channel 1.

The aperiodic attenuator supplies voltage $V_{SI}$, which is the value of $V_{SD}$, attenuated by an amount controlled by $S_1$ ($S_2$ in the case of transfer channel 2).

FIG. 2-b shows a second embodiment. It differs from the first in the switching of the phase shifting circuit with the inversion system. The phase shifting circuit, in structure which will be specified later, delivers at $S_D$ a signal $V_{SD}$ that is phase shifted and, at $S'_D$, a signal $V_{S'D}$ that is phase shifted by 180 degrees in relation to $V_{SD}$. The inversion system transmits at $S_I$ a signal VSI that is equal, either to $V_{SD}$ or to $V'_{SD}$, depending on control signal $S_3$ ($S_4$ in the case of transfer channel 2).

The aperiodic attenuator supplies the voltage $V_{ST}$ which is the value of $V_{SI}$, attenuated by an amount controlled by $S_1$ ($S_2$ in the case of transfer channel 2).

Figure 2C:
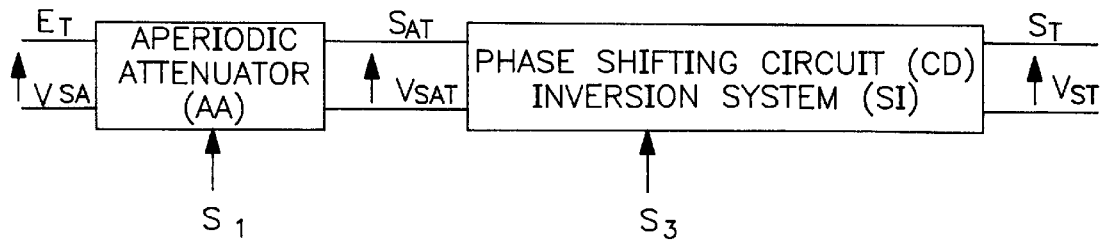
FIG. 2c is a third block diagram of a transfer channel associating an aperiodic attenuator and an assembly (phase shifting circuit, inversion system)

FIG. 2c is shows a third embodiment.

This embodiment differs from those of FIGS. 2-a and 2-B in that the attenuator is placed upstream of the phase shifting circuit and the inversion system.

The attenuator receives the signal $V_{SA}$ at its input ET and delivers the voltage $V_{SAT}$, which is the value of $V_{SA}$, attenuated by an amount controlled by $S_1$ ($S_2$ in the case of transfer channel 2). The structures and operating principles of the phase shifting circuit-inversion system assembly are as described in connection with FIGS. 2-a and 2-b.

Figure 3A:
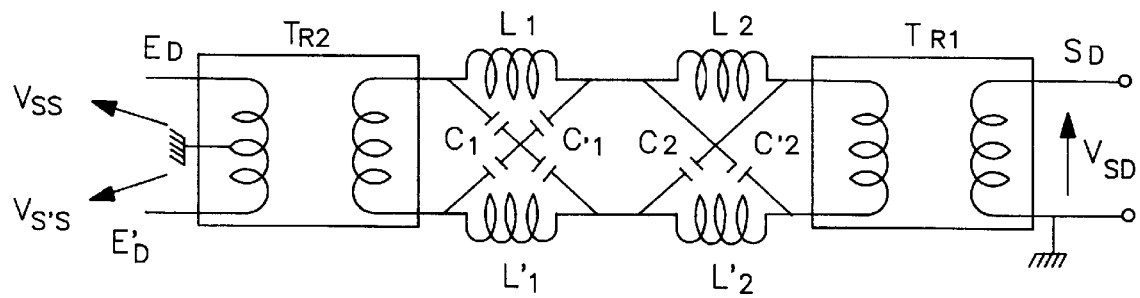
FIG. 3a is a first embodiment of a phase shifting circuit.
Figure 3B:
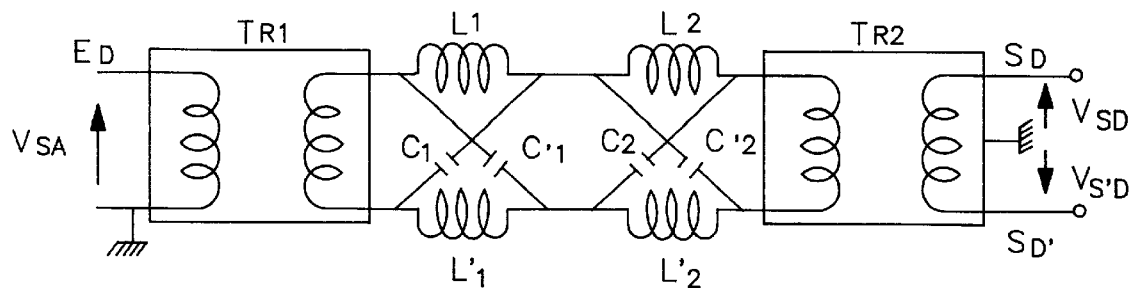
FIG. 3b is a second embodiment of a phase shifting circuit.

FIG. 3-a shows an embodiment of a phase shifting circuit as used in the embodiment of FIG. 2-a. The transformer placed at the input of circuit $TR_2$ is a wideband transformer and its primary with its centre tap enables an additional phase rotation of 180 degrees to be obtained, depending on whether the input signal $V_{SI}$ is applied to $E_D$ or the signal $V_{S'I}$ to $E'_D$. The part of the circuit that ensures the phase shifting is formed by a association of lattice cells, each cell being formed by two inductors and two capacitors.

In the example given, two cells are used : $L_1$, $L'_1$, $C_1$, $C'_1$ for one, and $L_2$, $L'_2$, $C_2$, $C'_2$ for the other. These cells are non dissipative and are of the "pass all" type. The output signal $V_{SD}$ is obtained by the transformer $TR_1$, which restores a dissymmetrical signal and ensures impedance matching.

FIG. 3-b shows the use of the circuit of FIG. 3-a in an inverted mode of operation. As the circuit is passive, it is reciprocal. Input signal $V_{SA}$ is applied at $E_D$ and transmitted by transformer $TR_1$ to the lattice mounted phase shifting cells. Transformer $TR_2$ transmits the output signals $V_{SD}$ at $S_D$ and $V_{S'D}$ at $S'_D$, these being phase shifted by 180 degrees in relation to one another. This circuit arrangement is suitable for the association in FIG. 2a.

The transformers used have a wide pass band and are available on the industrial products market, but they can be designed specially.

Figure 4A:
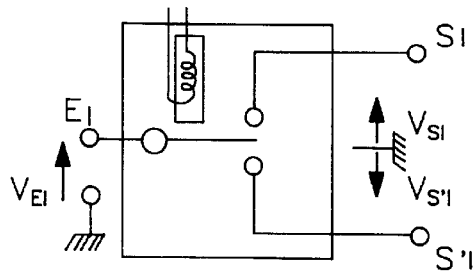
FIG. 4a is a first embodiment of an inversion system.
Figure 4B:
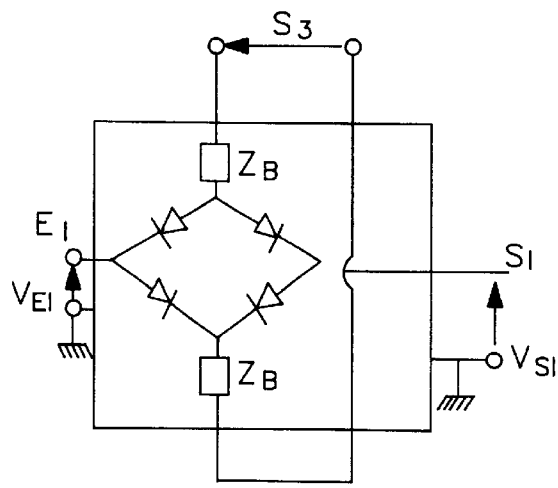
FIG. 4b is a second embodiment of an inversion system.

FIG. 4-a is a first embodiment of the inversion system using an electromechanical relay, the signal $V_{EI}$ being, depending on control signal $S_3$, equal to signal $V_{SI}$ or to signal $V_{S'I}$. FIG. 4-b is a second embodiment of an electronic switch that enables an inverter to be produced by associating two switches. Elements $Z_8$ have high impedance values for the useful signals. These are inductors, for example. When the signal $S_3$ is positive, diodes D are conductive and $V_{SI}=V_{EI}$, whereas, when $S_3$ negative, the diodes are blocked. A switch is thus produced.

These systems, two examples of which are shown in FIGS. 4-a and 4-b, can take other forms and are available on the industrial products market; however, they can be designed specially.

Figure 5A:
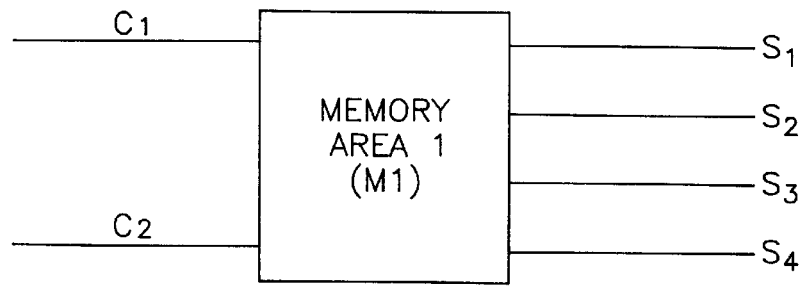
FIG. 5a is a block diagram of an embodiment of the control circuit if there is no correction, or if correction is effected globally for the entire useful frequency band (a case equivalent to defining only a single sub-band)
Figure 5B:
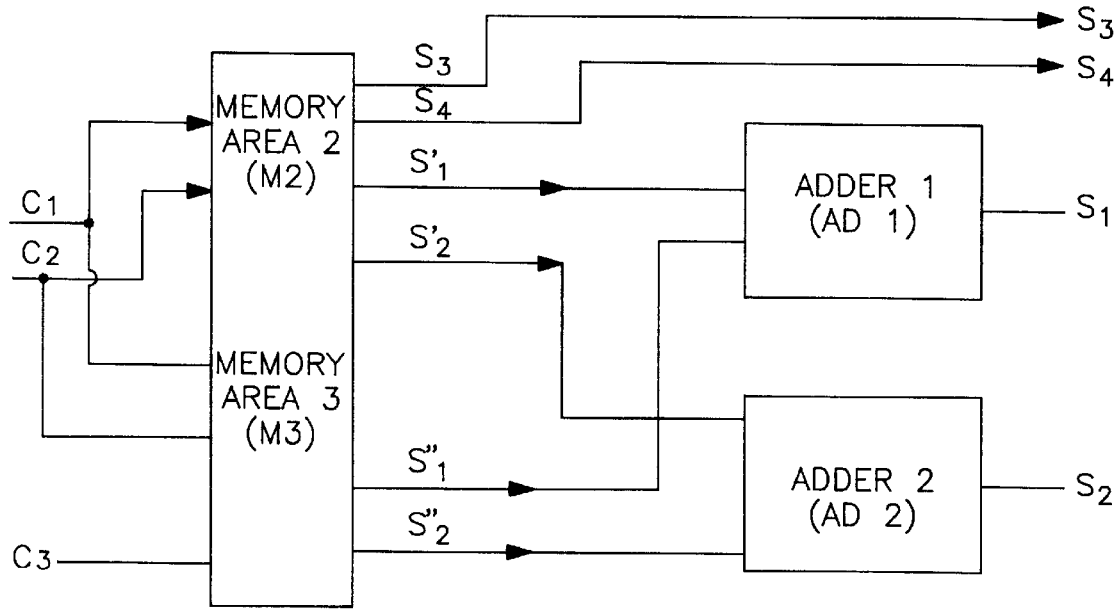
FIG. 5b is the block diagram of an embodiment of the control circuit with a correction effected with the use of at least two frequency sub-ranges.

FIG. 5-a is the block diagram of the control circuit that, can be used if no correction is effected or if correction is effected using only a single sub-band, that is to say, if a global correction is effected for the useful frequency band. In this case, the signals $C_1$ and $C_2$ described above are applied to addresses in a memory area ($M_1$) which delivers the signals $S_1$, $S_2$, $S_3$, $S_4$ described above.

FIG. 5-b is the block diagram of the control circuit that can be used if a correction is effected using at least two frequency sub-bands.

Signals $C_1$ and $C_2$ described above are applied to a memory area ($M_2$) which delivers the signals $S'_1$, $S_2$ giving the theoretical attenuation values for the attenuators, that is to say in the absence of any fault, and the control signals $S_3$ and $S_4$ of the inversion circuits.

Signals $C_1$, $C_2$ and $C_3$, described above are applied to a second memory area ($M_3$) which supplies, via the signals $S''_1$ and $S''_2$, the attenuator attenuation correction values per sub-range. Control signal $S_1$ is obtained by adding the digital signals $S'_1$, and $S''_2$ in an adding circuit, and control signal $S_2$ is obtained by adding the digital signals $S'_2$ and $S''_2$ in an adding circuit.

These circuits can take the form of hardware or of software in a computer.

The attenuators are preferably formed by PI resistive cells switched using a well known technique. These systems are available on the industrial products market, but they can be designed specially.

The phase shifting and attenuating device according to the invention has the following advantages:

Wideband operation;

Device comprising only elements that are passive, non-dissipative (with the exception of the attenuators), simple and available on the industrial products market;

Device having a very large dynamic range due to its passive structure;

Very low-noise device thanks to its passive, non-dissipative structure (except for the attenuators);

Device of high precision, obtained by pre-calibration and calibration fidelity in time thanks to the use of solely passive circuits;

Correction system simplified by corrections on a sub-band basis which considerably reduce the complexity of the correction system.

I claim:

1. Wideband device for producing, from an input signal ($V_E$), an output signal, each spectral component of which is shifted and attenuated from that of the input signal of the same frequency by phase shifting, adjustable from 0 to 360 degrees, and attenuation, adjustable from 1 to arbitrary values, said device including:

an adding circuit (CAD);

a control circuit (CC) for receiving and processing digital control signals ($C_1$, $C_2$) indicative of desired phase shift and attenuation and producing first output control signals ($S_1$, $S_2$), and second output control signals ($S_3$, $S_4$) in response thereto; a matching circuit (CA) which receives said input signal ($V_E$) and produces two signals ($V_{SA}$, $V_{S'A}$) in response thereto; two transfer channels ($V_{T1}$, $V_{T2}$) which respectively receive said two signals ($V_{SA}$, $V_{S'A}$) and deliver to said adding circuit (CAD) two transfer signals ($V_{ST}$, $V_{S'T}$), the spectral components of which are in phase quadrature and of algebraic amplitudes adjusted to obtain, via said adding circuit (CAD), said output signal, each spectral component of which output signal is phase shifted and attenuated by the values of said first output control signals ($S_1$, $S_2$), and second output control signals ($S_3$, $S_4$) obtained by applying said digital control signals ($C_1$, $C_2$) to said control circuit (CC) for processing, characterized in that:

the matching circuit (CA), the adding circuit (CAD) and the two transfer channels ($V_{T1}$, $V_{T2}$) are entirely passive circuits and wherein, each transfer channel comprises a cascaded inversion system (SI), phase shifting circuit (CD), and aperiodic attenuator (AA);

said phase shifting circuits (CD) comprising associated transformers, one of the windings of one transformer (TR2) having a center tap and the other winding coupled to a winding of the other transformer (TR1) by cells of "pass all" filters with each cell having two inductors and two capacitors for ensuring phase shifting;

said inversion systems (SI) comprising at least one of electromagnetic relays and associations of electronic switches and receiving said second output control signals ($S_3$, $S_4$);

said aperiodic attentuators (AA) comprising networks of switched resistors receiving said first output control signals ($S_1$, $S_2$);

a first memory area ($M_1$), and a second memory area ($M_3$) having fault absence attenuation values ($S'_1$, $S'_2$) stored therein; a correction system, in said control circuit (CC), for storing in said first memory area ($M_1$) the correspondence between said digital control signals ($C_1$, $C_2$) and said first output control signals ($S_1$, $S_2$) for said attenuators (AA) and said second output control signals ($S_3$, $S_4$) for said inversion systems (SI); and a sub-band based correction system, in said control circuit (CC), for storing in said second memory area ($M_3$), the corrections to be made on a sub-band basis and adding ($AD_1$, $AD_2$) said corrections to said fault absence attenuation values ($S'_1$, $S'_2$) to obtain first output control signal ($S_1$, $S_2$) values for input to said attenuators (AA) giving minimal error.

2. A weighting device for producing, from an input signal ($V_E$), an output signal, each spectral component of which is shifted and attenuated from that of the input signal of the same frequency by phase shifting, adjustable from 0 to 360 degrees, and attenuation, adjustable from 1 to arbitrary values, said device including:

an adding circuit CAD;

a control circuit (CC) for receiving and processing digital control signals ($C_1$, $C_2$) indicative of desired phase shift and attenuation and producing first output control signals ($S_1$, $S_2$) and second output control signals ($S_3$, $S_4$) in response thereto, a matching circuit (CA) for receiving said input signal ($V_E$) and producing two signals ($V_{SA}$, $V_{S'A}$) in response thereto;

two transfer channels ($V_{T1}$, $V_{T2}$) which respectively receive said two signals ($V_{SA}$, $V_{S'A}$) and deliver to said adding circuit (CAD) two transfer signals ($V_{ST}$, $V_{S'T}$) the spectral components of which are in phase quadrature and of algebraic amplitudes adjusted to obtain, via said adding circuit (CAD), said output signal, each spectral component of which output signal is phase shifted and attenuated by the values of said first output control signals ($S_1$, $S_2$) and said second output control signals ($S_3$, $S_4$) obtained by applying said digital control signals ($C_1$, $C_2$) to said control circuit (CC) for processing, characterized in that: the matching circuit (CA), the adding circuit (CAD) and the two transfer channels ($V_{T1}$, $V_{T2}$) are entirely passive circuits and wherein, each transfer channel comprises a cascaded inversion system (SI), phase shifting circuit (CD) and aperiodic attenuator (AA), with said inversion systems (SI) receiving said output control signals ($S_3$, $S_4$) and said aperiodic attentuators (AA) receiving said output control signals ($S_1$, $S_2$);

a first memory ($M_1$), and a second memory ($M_3$) having fault absence attenuation values ($S'_1$, $S'_2$) stored therein;

a correction system, in said control circuit (CC), for storing in said first memory ($M_1$) the correspondence between said digital control signals ($C_1$, $C_2$) and said first output control signals ($S_1$, $S_2$) for said attenuators (AA) and said second output control signals ($S_3$, $S_4$) for said inversion systems (SI); and a sub-band based correction system, in said control circuit (CC), for storing in said second memory ($M_3$), the corrections to be made on a sub-band basis and adding ($AD_1$, $AD_2$) said corrections to said fault absence attenuation values ($S'_1$, $S'_2$) to obtain first output control signal ($S_1$, $S_2$) values for input to said attentuators (AA) giving minimal error.

3. Device according to claim 2, characterized in that the phase shifting circuits (CD) comprise associated transformers, one of the windings of one transformer (TR2) having a center tap and the other winding coupled to a winding of the other transformer (TR1) by cells of "pass all" filters with each cell having two inductors couple to two capacitors ensuring phase shifting.

4. Device according to claim 3, characterized in that the inversion systems (SI) comprise at least one of electromagnetic relays and associations of electronic switches.

5. Device according to claim 4, characterised in that the aperiodic attentuators (AA) are formed by networks of switched resistors.

6. Device according to claim 5, characterized in that said device further comprises a correction system, in said control circuit (CC), for storing in said first memory ($M_1$) the correspondence between said digital control signals ($C_1$, $C_2$) and the output control signals for said attenuators ($S_1$, $S_2$) and inversion systems ($S_3$, $S_4$).

7. Device according to claim 2, characterized in that the aperiodic attentuators (AA) comprise networks of switched resistors.

8. A weighting device for producing, from an input signal ($V_E$), an output signal, each spectral component of which is shifted and attenuated from that of the input signal of the same frequency by phase shifting, adjustable from 0 to 360 degrees, and attenuation, adjustable from 1 to arbitrary values, said device including:

an adding circuit (CAD);
a control circuit (CC) for receiving and processing digital control signals ($C_1$, $C_2$) and producing first output control signals ($S_1$, $S_2$) and second output control signals ($S_3$, $S_4$) in response thereto;
a matching circuit (CA) which produces two signals ($V_{SA}$, $V_{S'A}$);
two transfer channels ($V_{T1}$, $V_{T2}$) for respectively receiving said two signals ($V_{SA}$, $V_{S'A}$) and delivering to said adding circuit (CAD) two transfer signals ($V_{ST}$, $V_{S'T}$) the spectral components of which are in phase quadrature and of algebraic amplitudes adjusted to obtain, via said adding circuit (CAD), said output signal, each spectral component of which output signal is phase shifted and attenuated by the values of said first output control signals ($S_1$, $S_2$) and said second output control signals ($S_3$, $S_4$) obtained by applying said digital control signals ($C_1$, $C_2$) to said control circuit (CC) for processing, characterized in that: the matching circuit (CA), the adding circuit (CAD) and the two transfer channels ($V_{T1}$, $V_{T2}$) are entirely passive circuits and wherein, each transfer channel comprises a cascaded inversion system (SI), phase shifting circuit (CD) and aperiodic attenuator (AA), with said inversion systems (SI) receiving said first output control signals ($S_3$, $S_4$) and said aperiodic attentuators (AA) receiving said second output control signals ($S_1$, $S_2$);

a first memory ($M_1$), and a second memory ($M_3$) and having fault absence attenuation values ($S'_1$, $S'_2$) stored therein;

a correction system, in said control circuit (CC), for storing in said first memory ($M_1$) the correspondence between said digital control signals ($C_1$, $C_2$) and said first output control signals ($S_1$, $S_2$) for said attenuators (AA) and said second output control signals ($S_3$, $S_4$) for said inversion systems (SI); and a sub-band based correction system, in said control circuit (CC), for storing in said second memory ($M_3$), the corrections to be made on a sub-band basis and adding ($AD_1$, $AD_2$) said corrections to said fault absence attenuation values ($S'_1$, $S'_2$) to obtain said first output control signal ($S_1$, $S_2$) values for input to said attenuators (AA) giving minimal error.

9. Device according to claim 8, characterized in that the inversion systems (SI) comprise at least one of electromagnetic relays and associations of electronic switches.

10. Device according to claim 9, characterized in that the aperiodic attentuators (AA) comprise networks of switched resistors.

* * * * *